(12) United States Patent
Pfeiffer et al.

(10) Patent No.: US 6,731,131 B2
(45) Date of Patent: May 4, 2004

(54) CIRCUIT FOR AN ELECTRONIC SEMICONDUCTOR MODULE

(75) Inventors: Johann Pfeiffer, Ottobrunn (DE);
Rainer Florian Schnabel, Höhenkirchen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/273,531

(22) Filed: Oct. 18, 2002

(65) Prior Publication Data

US 2003/0080336 A1 May 1, 2003

(30) Foreign Application Priority Data

Oct. 18, 2001 (DE) .......................................... 101 51 609

(51) Int. Cl.[7] .............................................. H03K 19/00
(52) U.S. Cl. ................................ 326/16; 326/9; 326/14
(58) Field of Search ................................. 326/9, 14, 16, 326/101

(56) References Cited

U.S. PATENT DOCUMENTS 5,072,138 A * 12/1991 Slemmer et al. ............... 326/16

2003/0102885 A1 * 6/2003 Tsuboi et al. .................. 326/16

OTHER PUBLICATIONS

Hans–Peter Messmer: "PC–Hardwarebuch" [PC hardware book], Addison–Wesley–Longman, Bonn, Germany, 5th ed. 1998, ch. 32.2.6, pp. 974–979.

* cited by examiner

Primary Examiner—Anh Tran
(74) Attorney, Agent, or Firm—Laurence A. Greenberg; Werner H. Stemer; Ralph E. Locher

(57) ABSTRACT

It is an aim to reduce an area required on a chip for interconnects which cross a spine center. The circuit has n inputs, which are disposed on one side of the spine center. An encoder is additionally provided, which is connected to the n inputs on an input side and to one end of the interconnects on an output side and which is likewise disposed on one side of the spine center. In this case, a number n of the inputs is greater than a number of the interconnects. A decoder, which is connected to the other end of the interconnects on the input side and to n outputs on the output side, is disposed on the other side of the spine center.

13 Claims, 5 Drawing Sheets

CIRCUIT FOR AN ELECTRONIC SEMICONDUCTOR MODULE

BACKGROUND OF THE INVENTION

Field of the Invention

The invention relates to a circuit for an electronic semiconductor module having interconnects which cross a specific region, a spine center, of the semiconductor module.

Various tests, also called test modes hereafter, are necessary in order to be able to test memory modules, for example dynamic random access memory (DRAMs). By way of example, the memory modules must be able to be brought to an extreme state with regard to the operating temperature and the operating voltage. What is achieved in the so-called burn-in test is that the memory module is already optimized by the manufacturer of the memory module with regard to the time duration until the occurrence of a fault (mean time between failures), that is to say the mean availability duration. Moreover, various parameters, such as critical timings, for example, must be able to be set during the production of the memory module. In a further test mode, a fault analysis can be affected in which parts of the memory module can be switched off. An additional test mode may be fast, efficient scanning of the memory cells in order to check the functionality thereof.

The test modes are achieved by extraordinary commands that are no longer necessary for the actual operation of the memory module. Therefore, test modes which set functions that are not available as standard are required for the comprehensive and efficient test of the memory module.

For these tests, the memory module is provided with interconnects. The latter are generally disposed beside further interconnects, which belong as data lines to the voltage supply and the signal-processing logic, on the memory module in such a way that they divide the latter into four quadrants. Each of the quadrants contains memory cells. In this case, the interconnects form a cross whose crossover region is also called a spine center hereafter. The control signals required for the test modes come from a central decoder circuit and are passed by a number of lines (metal lines or interconnects) from the central test mode circuit to their respective function block. Some also cross the spine center in this case. Mostly, however, the metal lines lying right at the top which run through the spine center delimit the chip area.

SUMMARY OF THE INVENTION

It is accordingly an object of the invention to provide a circuit for an electronic semiconductor module which overcome the above-mentioned disadvantages of the prior art devices of this general type, in which the area required for the wiring of the electronic semiconductor module and thus implicitly the total area of the electronic semiconductor module can be reduced.

With the foregoing and other objects in view there is provided, in accordance with the invention, a circuit for an electronic semiconductor module. The circuit contains a specific region defining a first side and a second side, m interconnects crossing the specific region and having first ends and second ends, and n inputs disposed on the first side defined by the specific region. A number of the n inputs being greater than a number of the m interconnects. An encoder has inputs coupled to the n inputs and outputs connected to the first ends of the m interconnects. The encoder is disposed on the first side of the specific region. n outputs are provided and a decoder having inputs is connected to the second ends of the m interconnects and has outputs coupled to the n outputs. The decoder is disposed on the second side defined by the specific region.

The number of chips per wafer can advantageously be increased thereby.

The circuit according to the invention for an electronic semiconductor module has m interconnects which cross a specific region and has n inputs, which are disposed on one side of the region. In this case, the number n of inputs is greater than the number m of interconnects. An encoder is additionally provided, which is connected to the n inputs on the input side and to one end of the m interconnects on the output side and which is likewise disposed on one side of the region. A decoder, which is connected to the other end of the m interconnects on the input side and to n outputs on the output side, is disposed on the other side of the region.

It is advantageous that an edge detector is connected between the inputs and the encoder. As a result, if a level change occurs at the input of the edge detector, the edge detector generates a change in the signal level for a defined time duration.

A predecoder and an edge detector for the detection of positive edges are provided, which are connected between the inputs and the encoder. Therefore, even changes in the signal levels that occur simultaneously at the inputs can be processed.

A first switching and memory device is provided, which is connected to the outputs of the decoder on the input side.

A post-decoder is connected downstream of the decoder and a second switching and memory device is provided, which has an input connected to the output of the post-decoder. As a result, signals that are intended to be switched through simultaneously can also be processed.

The circuit according to the invention has a checking device for checking for simultaneity. If appropriate, it generates a control signal and feeds it to the encoder for coding. The decoder decodes the control signal and feeds it to the switching and memory device. The control signal can be used to signal that, if the semiconductor module is in the test mode, the test mode is now to be ended and left.

The checking device identifies a signal as a control signal when a plurality of signals at the inputs simultaneously change their state.

The edge detector has an input terminal, an output terminal and an exclusive-NOR element, the signal present at the input terminal of the edge detector being fed to the exclusive-NOR element undelayed in one instance and delayed in one instance, and the output of the exclusive-NOR element being connected to the output terminal of the edge detector.

The edge detector for the detection of positive edges has an input terminal, an output terminal and an AND element, the signal present at the input terminal of the edge detector being fed to the AND element undelayed in one instance and delayed in another instance, and the output of the AND element being connected to the output terminal of the edge detector for the detection of positive edges.

In the circuit, the encoder converts the n inputs to the m interconnects in a binary coded manner.

In the circuit, the first switching and memory device has a memory, the content of the memory changing with every second pulse of the signal present at the input of the first switching and memory device.

In the circuit, the second switching and memory device has a memory, the content of the memory being overwritten with each signal present at the input of the second switching and memory device, if an enable signal allows this.

In an advantageous manner, in the circuit according to the invention, different test modes can be set at the inputs by different addresses.

Other features which are considered as characteristic for the invention are set forth in the appended claims.

Although the invention is illustrated and described herein as embodied in a circuit for an electronic semiconductor module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
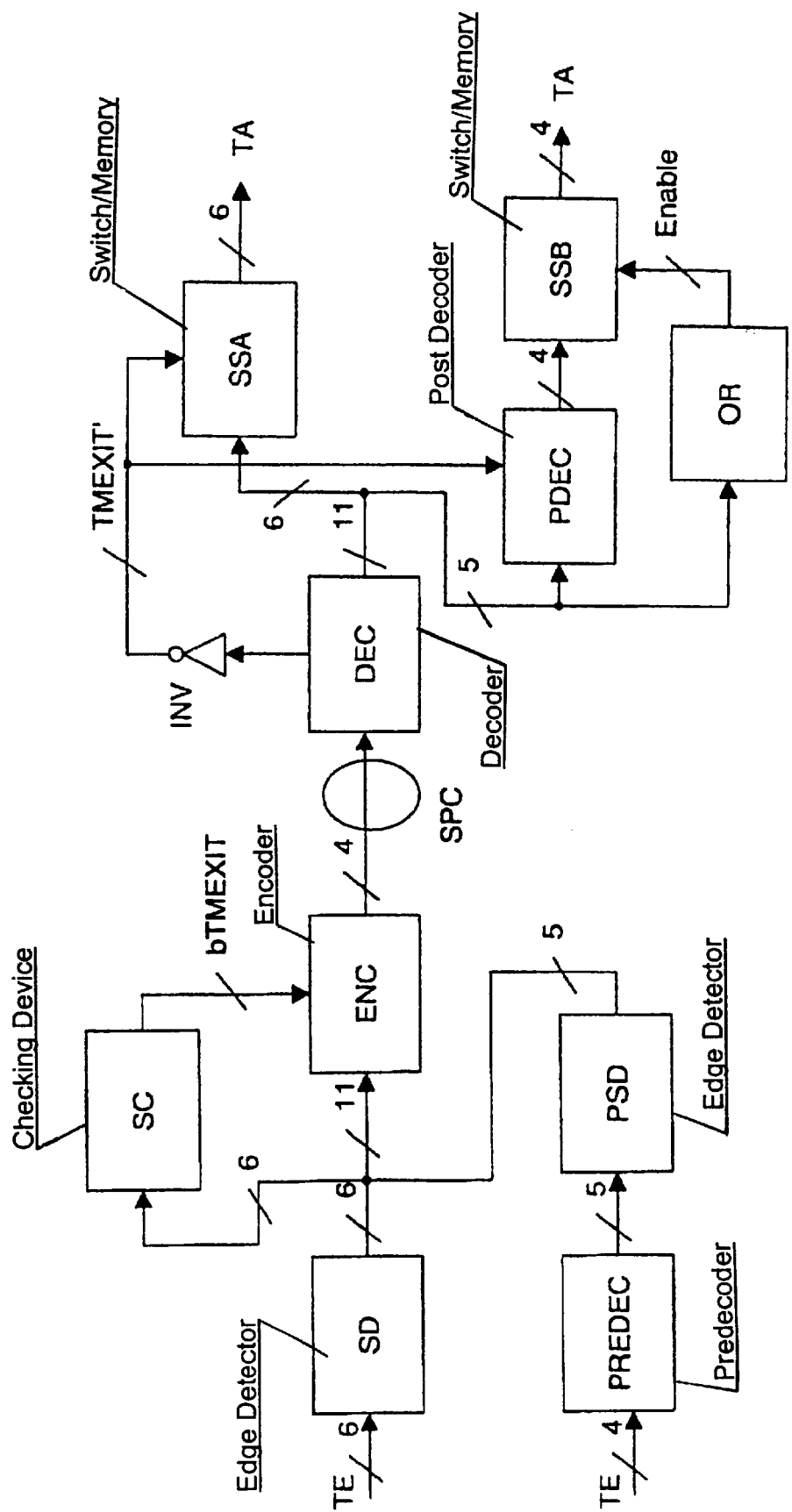
FIG. 1 is a block diagram of an embodiment of a circuit according to the invention.

Referring now to the figures of the drawing in detail and first, particularly, to FIG. 1 thereof, there is shown, in a block diagram, a possible embodiment of a circuit according to the invention for an electronic semiconductor module. Test mode signals for the selection of a specific test mode are applied to ten inputs of the circuit, also called test inputs hereinafter. In this case, a distinction is made between test mode signals of group A and test mode signals of group B. Test mode signals of group A occur sequentially, that is to say not simultaneously, at the top six test inputs TE, whereas test mode signals of group B, which are present at the bottom four test inputs TE, occur simultaneously.

The six test inputs TE at which the test mode signals of group A are present are connected to the inputs of a first edge detector SD (slope detector).

The four test inputs TE at which the test mode signals of group B are present are connected to the inputs of a predecoder PREDEC. The test mode signals of group B have to pass through the predecoder PREDEC, which generates temporally separate state signals.

A logic table of the predecoder PREDEC may appear as follows:

| Test input | Output | | | | |
|---|---|---|---|---|---|
| | Test mode 1 | Test mode 2 | Test mode 3 | Test mode 4 | Test mode 5 |
| 1 | 1 | 1 | 0 | 0 | 0 |
| 2 | 0 | 1 | 0 | 0 | 0 |
| 3 | 0 | 1 | 0 | 1 | 0 |
| 4 | 0 | 1 | 1 | 1 | 0 |

In the case of the embodiment of the invention as shown in FIG. 1, six test inputs TE are provided for test mode signals of group A and four test inputs TE are provided for test mode signals of group B. However, such a division is not absolutely necessary. The number of test inputs TE results from the technical requirements.

On the output side, the predecoder PREDEC is connected to the inputs of a second edge detector positive slope detector PSD, which only detects positive edges. A positive edge is to be understood hereinafter as a signal edge that occurs when the signal changes from the low state to the high state.

In this case, the predecoder PREDEC converts the four test inputs TE for the test mode signals of group B to five lines, so that the signals are now present sequentially, just like the test mode signals of group A, on the five lines.

The six outputs of the first edge detector SD and the five outputs of the second edge detector PSD are connected to eleven inputs of an encoder ENC.

The latter converts the total of eleven lines to four lines using of binary coding. As a result, instead of originally ten test lines, only four lines, also called interconnects hereinafter, run over the chip, and cross further interconnects in the spine center. As a result, it is possible to significantly reduce the area in the crossover region of the interconnects, which has a positive effect on the total area required for the semiconductor module.

After the spine center SPC, the four interconnects are connected to a decoder DEC, which performs the inverse transformation or decoding from four to eleven interconnects. Thus, the same state as prevails before the encoder ENC is produced after the decoder DEC.

Six of the eleven outputs of the decoder DEC are connected to a first signal switch and memory SSA, also called first test mode switch hereinafter. The signals of group A can be tapped off at the outputs TA (outputs) of the first signal switch and memory SSA.

The remaining five of the eleven outputs of the decoder DEC are connected to a post-decoder PDEC, which, on the output side, is in turn connected to a second signal switch and memory SSB, also called second test mode switch hereinafter. The signals of group B can be tapped off at outputs TA of the second signal switch and memory SSB.

An OR element OR, which is connected to the outputs of the decoder DEC on the input side, generates, on the output side, an enable signal Enable, which is fed to the second signal switch and memory SSB. The OR element OR detects whether signals of group B are present. To that end, all the signals of group B are ORed.

The encoder ENC is controlled by a checking device SC (simultaneity check). The checking device SC checks the six signal lines originating from the output of the first edge detector SD for simultaneity. If this is the case, a corresponding test mode exit command TMEXIT or an inverted test mode exit command bTMEXIT is sent to the encoder ENC.

Figure 2:
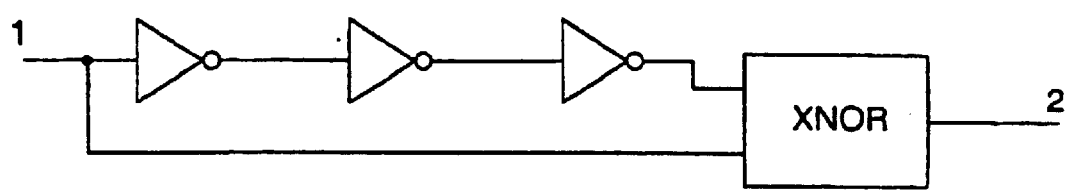
FIG. 2 is a block diagram showing a part of an edge detector in detail, as can be used in the circuit according to the invention.

A part of the edge detector SD, as can be used in the circuit according to the invention, is shown in detail in FIG. 2. The signal present at an input 1 of the edge detector SD is passed to two inputs of an exclusive-NOR element XNOR delayed by three inverters in one instance and undelayed in another instance. This has the result that, at the output of the exclusive-NOR element XNOR and thus at an output 2 of the edge detector SD, with each edge change of the signal which is present at the input 1 of the edge detector SD, a pulse with a defined duration, for example 1 ns, is present at the output 2 of the edge detector SD.

Figure 3:
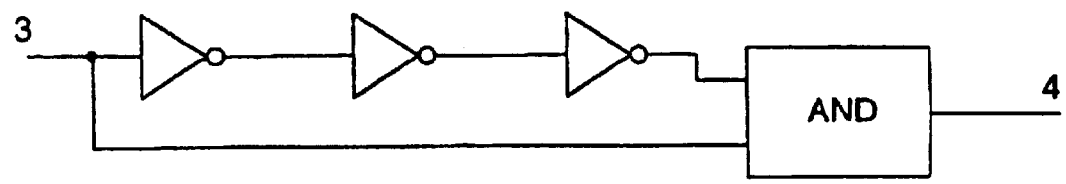
FIG. 3 is a block diagram showing a part of the edge detector for the detection of positive edges in detail, as can be used in the circuit according to the invention.

A part of the edge detector PSD that detects positive edge changes, as can be used in the circuit according to the invention, is shown in detail in FIG. 3. A signal present at an input 3 of the edge detector PSD is passed to two inputs of an AND element AND delayed by three inverters in one instance and undelayed in another instance. This has the result that, at the output of the AND element AND, and thus at the output 4 of the edge detector PSD, with each positive edge change of the signal which is present at the input 3 of the edge detector PSD, a pulse with a defined duration, for example 1 ns, is present at the output 4 of the edge detector PSD.

Figure 4:
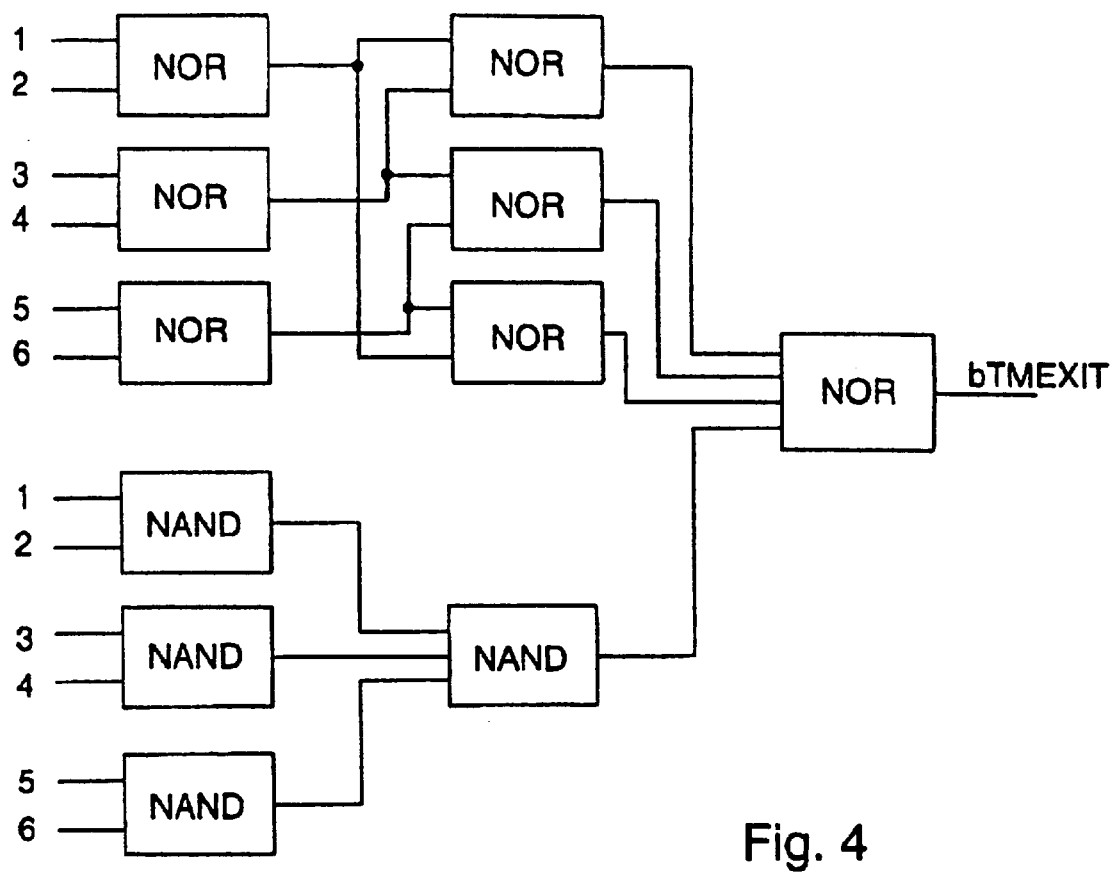
FIG. 4 is a block diagram showing a checking circuit for checking whether a plurality of signals occur simultaneously, which can be used in the circuit according to the invention.

The checking unit SC shown in FIG. 4, also called a checking device, as can be used in the circuit according to the invention, is used to identify whether control signals are present simultaneously at the test inputs TE 1–6. If this is the case, then the checking device SC identifies this and generates a test mode exit command bTMEXIT at its output. The suitable linking of the individual NAND and NOR elements with one another results from Boolean logic. The signals generated by the positive edge detector are present at the input of the checking device SC.

Figure 5:
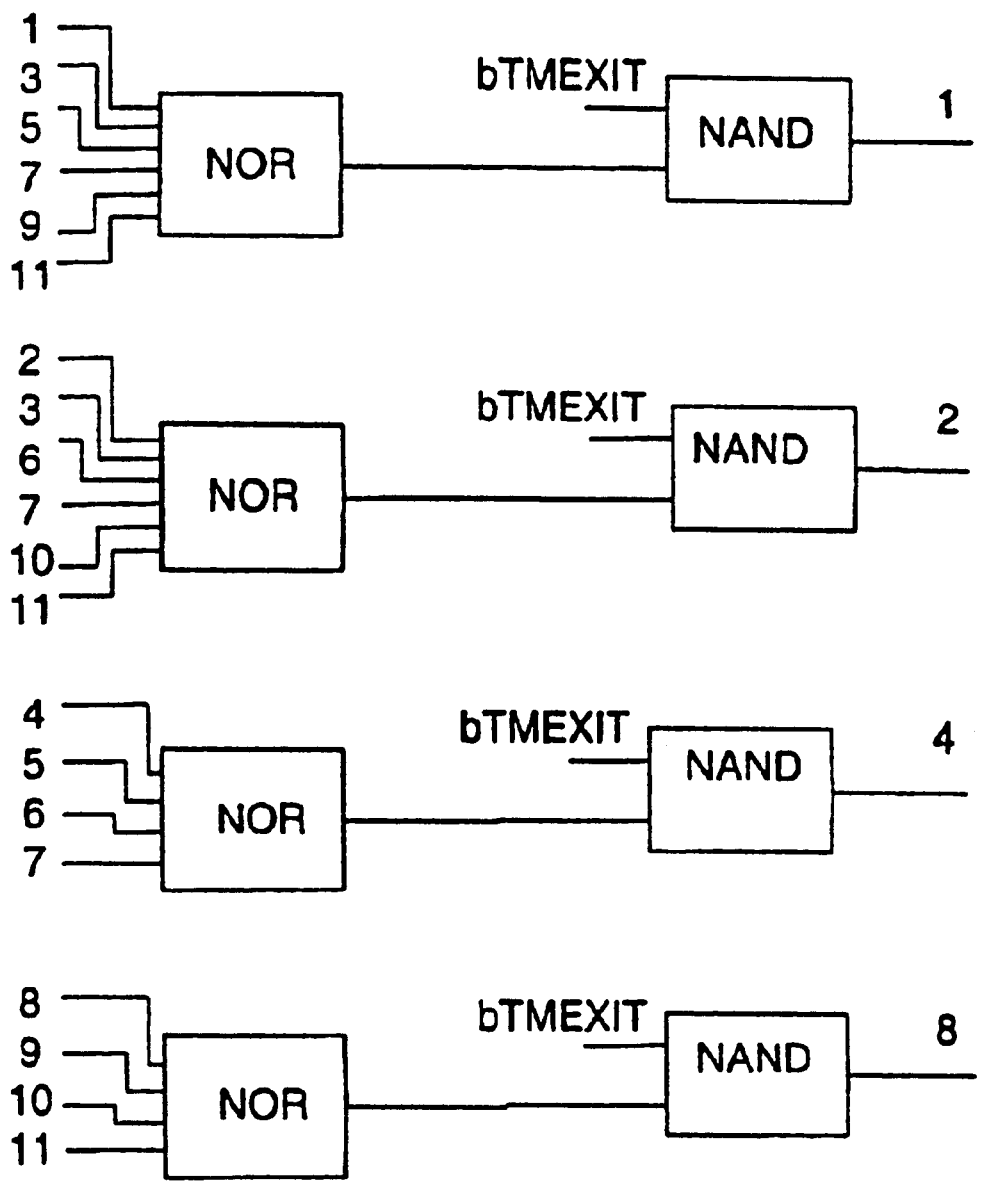
FIG. 5 is a block diagram showing an embodiment of an encoder, as can be used in the circuit according to the invention.

The encoder ENC, as is explained in greater detail in FIG. 5, converts the eleven signal lines, of which six originate from group A and five from group B, to four interconnects. The test mode exit command bTMEXIT originating from the checking unit SC is passed to the inputs of the NAND elements of the encoder ENC shown in FIG. 5. If the level of the test mode exit command bTMEXIT is low, then the high levels are in each case present at the outputs of the NAND elements, independently of the levels present at the other inputs of the NAND elements. Thus, via the spine center SPC, the test mode exit command bTMEXIT, coded as 1111, is transmitted and, consequently, a test end is signaled.

Figure 6:
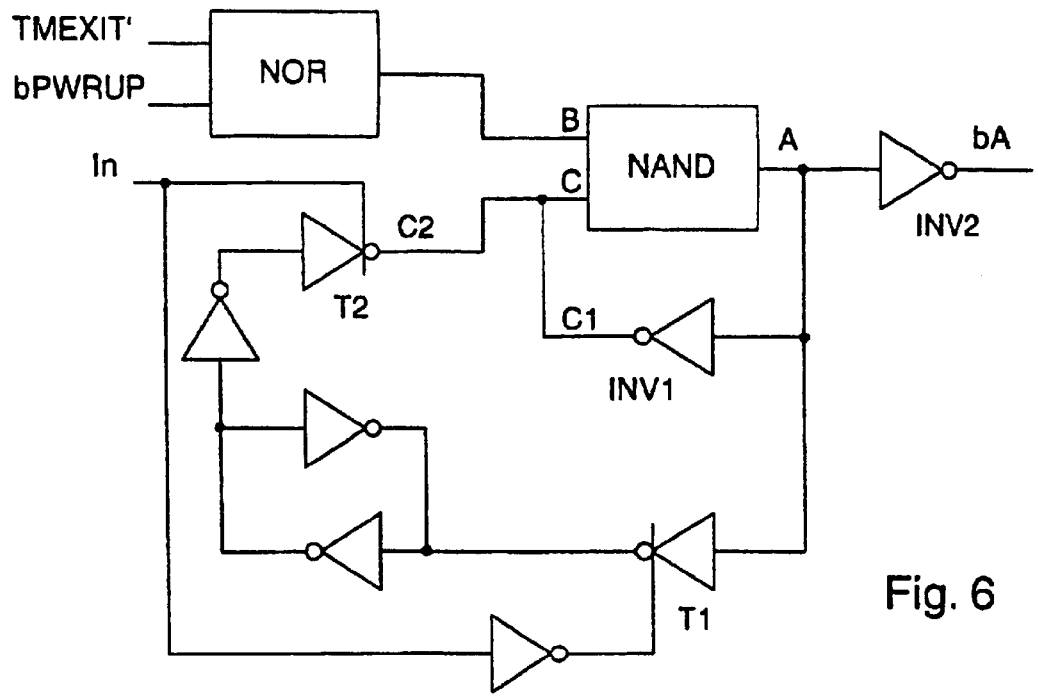
FIG. 6 is a block diagram showing a first test mode switch, as can be used in the circuit according to the invention.

The construction of the encoder ENC in accordance with FIG. 5 represents one possible embodiment of the invention. The number of inputs and outputs and thus the conversion ratio of the encoder ENC result from the technical boundary conditions. FIG. 6 shows a part of the first test mode switch SSA. If the two signals TMEXIT' and bPWRUP at the inputs of the NOR element are at low, then the high level is present at the output of the NOR element and thus at the input B of the NAND element. In this state, the signal present at the control input In influences the state of the signal at an output A of the NAND element. If the level of the signal at the control input In is at high, then the tri-state element T2 is inhibited and the tri-state element T1 operates as an inverter.

For the case where a high level is present at the output A, the level is inverted by the inverter INV1 and the low level is present at the output C1 of the inverter INV1. On the other hand, the high level is present at an output C2 of the tri-state element T2. The circuit is configured such that the level at the output C2 of the tri-state element T2 overwrites the level at the output C1 of the inverter INV1. Thus, the low level is now present at the output A of the NAND element. The feedback is now switched off by the signal level of the signal at the control input In changing to low. As a result, the tri-state inverter T2 undergoes transition to the high-impedance state, and the signal at the output A of the NAND element thus remains at low since the output C1 of the inverter INV1, whose level is at high, is now utilized. If the level of the signal at the control input In is now changed to high again, the signal at the output A of the NAND element will change to high and remain at high until the signal at the control input In changes to high for a third time. Thus, each state change of the signal at the control input In from low to high leads to a state change of the signal at the output A. The signal at the output A is inverted by an inverter INV2 connected downstream of the NAND element and made available as inverted output bA of the first test mode switch SSA.

A test mode switch in accordance with FIG. 6 is provided for each test mode signal of group A. Since, in the exemplary embodiment of the invention as shown in FIG. 1, six lines are provided for test mode signals of group A, the test mode switch in accordance with FIG. 6 is to be constructed six-fold.

Figure 7:
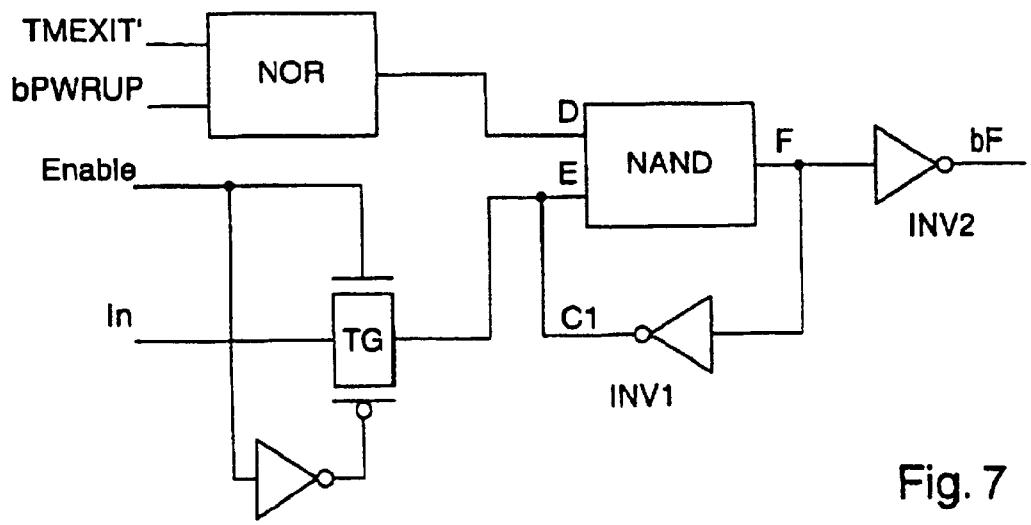
FIG. 7 is a block diagram showing a second test mode switch, as can be used in the circuit according to the invention.

FIG. 7 shows a part of the second test mode switch SSB. If the two signals TMEXIT' and bPWRUP at the inputs of the NOR element are at low, then the high level is present at the output of the NOR element and thus at the input D of the NAND element. In this state, the signal present at the control input In, together with the enable signal (control signal) Enable, influences the state of the signal at an output F of the NAND element. For the case where the level of the signal at the output F of the NAND element is high, low is present at the input E of the NAND element owing to the inverter INV1. Thus, the signal at the output F is in a stable state. If the enable signal Enable is then at high and the signal at the control input In and thus also the signal at the input E are at low, the level of the signal at the output F remains at high. If the signal at the control input In changes to high, while the enable signal Enable remains at high, the signal at the input E likewise becomes high and the level at the output F changes to low. With the enable signal Enable set, the signal at the control input In is high, the signal at the input E is likewise high and the level at the output becomes low. If the enable signal Enable is low, then the level at the output F remains unchanged, independently of the level of the signal at the control input In. The end of the high state of the enable signal Enable must precede the state change of the signal that is present at the control input In.

Two field-effect transistors, one being an n-channel field-effect transistor and one being a p-channel field-effect transistor, together form the transfer gate TG. Such a construction of the transfer gate TG is used to save power.

The enable signal Enable is an indicator of test mode signals of group B.

The signal bPWRUP is used by the user for a defined start-up of the semiconductor module.

The output F is inverted by an inverter INV2 connected downstream of the NAND element and made available as inverted output bF of the second test mode switch SSB.

A test mode switch SSB in accordance with FIG. 7 is provided for each signal of group B. Since, in the exemplary embodiment of the invention as shown in FIG. 1, four lines are provided for signals of group B, the test mode switch SSB in accordance with FIG. 7 is to be constructed fourfold.

In principle, the invention can be applied to lines that cross the spine center. Particularly suitable lines are ones in which the signals that they carry change their state only rarely, that is to say not with every clock cycle. These are, in particular, test mode and characterization lines and also lines which carry mode signals that are set by the register set or the extended mode register set. These define, for example, the CAS latency, the burst length, the DLL settings and driver strengths. The invention can also be used for lines which carry status signals associated with commands such as write, read, precharge, refresh, self-refresh, etc.

We claim:

1. A circuit for an electronic semiconductor module, comprising:
   a specific region defining a first side and a second side;
   m interconnects crossing said specific region and having first ends and second ends;
   n inputs disposed on said first side defined by said specific region, a number of said n inputs being greater than a number of said m interconnects;
   an encoder having inputs coupled to said n inputs and outputs connected to said first ends of said m interconnects, said encoder disposed on said first side of said specific region;
   n outputs; and
   a decoder having inputs connected to said second ends of said m interconnects and outputs coupled to said n outputs, said decoder disposed on said second side defined by said specific region.

2. The circuit according to claim 1, further comprising an edge detector connected between said inputs and said encoder.

3. The circuit according to claim 2, further comprising:
   a predecoder connected to said inputs; and
   a further edge detector for detecting positive edges connected between said predecoder and said encoder.

4. The circuit according to claim 3, further comprising a switching and memory device having inputs connected to said outputs of said decoder.

5. The circuit according to claim 4, further comprising:
   a post-decoder connected downstream of said decoder and having outputs; and
   a further switching and memory device having inputs connected to said outputs of said post-decoder.

6. The circuit according to claim 5, further comprising a checking device for checking whether simultaneity is present at said inputs, said checking device connected to and feeding a control signal to said encoder, said encoder coding the control signal, and said decoder connected to and feeding a decoded control signal to said switching and memory device and said further switching and memory device.

7. The circuit according to claim 6, wherein said checking device generates the control signal when a plurality of signals at said inputs simultaneously change their state.

8. The circuit according to claim 2, wherein said edge detector has an input terminal, an output terminal and an exclusive-NOR element with an output, a signal present at said input terminal of said edge detector is fed to said exclusive-NOR element undelayed in one instance and delayed in another instance, and said output of said exclusive-NOR element is connected to said output terminal of said edge detector.

9. The circuit according to claim 3, wherein said further edge detector for the detection of positive edges has an input terminal, an output terminal and an AND element with an output, a signal present at said input terminal of said further edge detector for the detection of positive edges is fed to said AND element undelayed in one instance and delayed in another instance, and said output of said AND element is connected to said output terminal of said further edge detector for the detection of positive edges.

10. The circuit according to claim 1, wherein said encoder converts n input signals received from said n inputs to m interconnect signals output to said m interconnects in a binary coded manner.

11. The circuit according to claim 4, wherein said switching and memory device has a memory, a content of said memory changing with every second pulse of a signal present at one of said inputs of said switching and memory device.

12. The circuit according to claim 5, wherein said further switching and memory device has a memory, a content of said memory being overwritten with each signal present at one of said inputs of said further switching and memory device, if an enable signal allows this.

13. The circuit according to claim 1, wherein different test modes can be set at said inputs by different addresses.

* * * * *